United States Patent
Park et al.

(10) Patent No.: US 7,285,910 B2
(45) Date of Patent: Oct. 23, 2007

(54) ORGANIC ELECTROLUMINESCENCE DEVICE FOR PREVENTING CURRENT LEAKAGE AND IMPROVING INKJET-PRINTING QUALITY

(75) Inventors: Joon Young Park, Seoul (KR); Jae Jung Kim, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 145 days.

(21) Appl. No.: 10/683,286

(22) Filed: Oct. 14, 2003

(65) Prior Publication Data

US 2004/0085014 A1      May 6, 2004

(30) Foreign Application Priority Data

Nov. 4, 2002    (KR)    ...................... 10-2002-0067975

(51) Int. Cl.
 *H05B 33/00*   (2006.01)
 *H01J 1/62*    (2006.01)

(52) U.S. Cl. .................. 313/506; 313/504; 313/503; 428/690; 428/917

(58) Field of Classification Search ................ 313/504, 313/506
See application file for complete search history.

(56) References Cited

U.S. PATENT DOCUMENTS

| | | | | |
|---|---|---|---|---|
| 5,253,100 A | * | 10/1993 | Yang et al. | 359/266 |
| 5,705,888 A | * | 1/1998 | Staring et al. | 313/503 |
| 5,719,467 A | * | 2/1998 | Antoniadis et al. | 313/506 |
| 5,798,170 A | * | 8/1998 | Zhang et al. | 428/212 |
| 5,856,409 A | * | 1/1999 | Ziemelis et al. | 525/330.2 |
| 6,045,977 A | * | 4/2000 | Chandross et al. | 430/311 |
| 6,285,124 B1 | * | 9/2001 | Nagayama et al. | 313/506 |
| 6,416,885 B1 | * | 7/2002 | Towns et al. | 428/690 |
| 6,649,327 B2 | * | 11/2003 | Kim et al. | 430/313 |
| 6,689,632 B2 | * | 2/2004 | Kim et al. | 438/29 |
| 6,866,946 B2 | * | 3/2005 | Cao et al. | 428/690 |
| 6,933,520 B2 | * | 8/2005 | Yamazaki | 257/40 |
| 2002/0074936 A1 | | 6/2002 | Yamazaki et al. | |
| 2003/0227253 A1 | * | 12/2003 | Seo et al. | 313/504 |
| 2004/0214039 A1 | * | 10/2004 | Mackenzie et al. | 428/690 |

FOREIGN PATENT DOCUMENTS

| | | |
|---|---|---|
| GB | 2332895 | 7/1999 |
| JP | 04-255692 | 9/1992 |
| JP | H09-230129 | 9/1997 |
| JP | 11-297472 | 10/1999 |
| JP | 2002-246172 | 8/2002 |
| WO | 96-08047 | 3/1996 |

* cited by examiner

*Primary Examiner*—Sikha Roy
(74) *Attorney, Agent, or Firm*—H.C. Park & Associates, PLC

(57) ABSTRACT

A method of fabricating an organic electroluminescent display by forming a lower electrode on a substrate and forming an insulating film with an opening part for exposing a portion of the lower electrode. An organic thin film is formed on the substrate and a surface of a portion of the organic thin film layer is selectively treated. A luminescent layer is formed on another portion of the organic thin film layer; and an upper electrode is formed on the front of the substrate.

5 Claims, 2 Drawing Sheets

ORGANIC ELECTROLUMINESCENCE DEVICE FOR PREVENTING CURRENT LEAKAGE AND IMPROVING INKJET-PRINTING QUALITY

CROSS REFERENCE TO RELATED APPLICATION

This application claims priority to and the benefit of Korean Patent Application No. 2002-67975 filed on Nov. 4, 2002, the disclosure of which is hereby incorporated by reference in its entirety.

BACK GROUND OF THE INVENTION

1. Field of the Invention

The present invention relates to an organic electroluminescent display and, more particularly, to an organic polymer electroluminescent device capable of preventing leakage current between adjacent pixels and improving inkjet-printing quality of a luminescent layer by selectively treating the surface of a hole transport layer and a method for fabricating the same.

2. Description of Related Art

FIG. 1 illustrates a cross sectional view of one pixel of a conventional organic electroluminescent display.

Referring to FIG. 1, a buffer layer 110 is formed on an insulating substrate 100, and a thin film transistor 120 is formed on the buffer layer 110 in an ordinary manner. As shown in FIG. 1, the thin film transistor comprises a gate 125, a source electrode 127, which is electrically connected to the source region 121, and a drain electrode 129 which is electrically connected to the drain region 123.

A via hole 135 for exposing one of the source electrode 127 or the drain electrode 129, e.g., the drain electrode 129 is formed on an insulating film 130 after the insulating film 130 is formed on the thin film transistor 120 and the buffer layer 110. A lower electrode 140 which is connected to the drain electrode 129, for example, through the via hole 135 is formed on the insulating film 130. An opening part 155 for exposing the lower electrode 140 is formed by patterning a planarization film 150 after the planarization film 150 is deposited on the substrate.

Subsequently, a hole transport layer 160 is formed, for example, by spin coating an organic material such as PEDOT (Poly-3, 4-Ethylenedioxythiophene) or PANI (polyaniline) on the substrate. A luminescent layer 170 is formed on the hole transport layer 160 of the opening part 155 via an inkjet process, and an upper electrode 180 is formed over the substrate.

Ordinarily, the luminescent layer is formed by using an inkjet process or by using laser induced thermal imaging (LITI) process when an organic polymer material is used as the luminescent layer of the organic electroluminescent display.

The inkjet process is a process for forming the luminescent layer on a lower electrode by injecting the solution onto the substrate from the inkjet head. The solution is ejected at a high speed from a head containing solution comprising EL (electro-luminescence) material, e.g., organic polymer EL material, such that the solution is arranged while the inkjet head is spaced apart from the substrate at a certain distance.

Although respective R, G and B luminescent layers should be independently formed per each pixel in an organic luminescent display, there has been a problem in that a solution comprising organic polymer material which is ejected from the head is dispersed onto adjacent pixels in case of the inkjet process.

In order to solve the problem, it is suggested in Korean Patent Application No. 10-1999-7010647 that a luminescent layer is formed after forming a bank layer to cover the edge part of the lower electrode per each pixel. The bank layer is formed of an insulating material. The method for forming a luminescent layer via an inkjet process using the bank layer enables the luminescent layer to be independently formed per each pixel by preventing a solution comprising an organic polymer material from being dispersed onto adjacent other pixels. Thus, by using the bank layer the solution is provided only on the upper part of the lower electrode of a relevant pixel.

However, there has been a problem in that printing quality is lowered as a solution comprising an organic polymer material is dispersed on the bank layer since surface characteristics of the hole transport layer are maintained in all the pixels on the substrate by forming a hole transport layer over the substrate after the bank layer is formed, even when the inkjet process uses the bank layer.

Furthermore, a conventional organic electroluminescent display forms a hole transport layer 160 that has conductivity between the lower electrode 140 and the luminescent layer 170. Thus, luminescence efficiency is improved by improving injection efficiency of holes from the lower electrode 140 to the luminescent layer 170. However, there has been a problem in that light is emitted even from adjacent off pixels because the hole transport layer which is conductive is formed over the substrate. Thus, leakage current flows between the hole transport layer 160, which is conductive and the lower electrode 140.

There have also been problems in that a process for forming an additional partition wall is required, and adhesion defects are generated between the succeeding cathode electrode and the organic luminescent layer due to the stepped profile of a the thick partition wall. When the organic luminescent layer is formed using a partition wall for defining a pixel region on which the organic luminescent layer is to be formed, a thick partition wall should be formed to cover the edge part of a pixel electrode.

SUMMARY OF THE INVENTION

This invention provides a method of fabricating an organic electroluminescent display by forming a lower electrode on a substrate and forming an insulating film with an opening part for exposing a portion of the lower electrode. An organic thin film is formed on the substrate and a surface of a portion of the organic thin film layer is selectively treated. A luminescent layer is formed on another portion of the organic thin film layer; and an upper electrode is formed on the front of the substrate.

BRIEF DESCRIPTION OF THE DRAWINGS

Further objects and advantages of the invention can be more fully understood from the following detailed description taken in conjunction with the accompanying drawings.

DETAILED DESCRIPTION OF THE INVENTION

Figure 1:
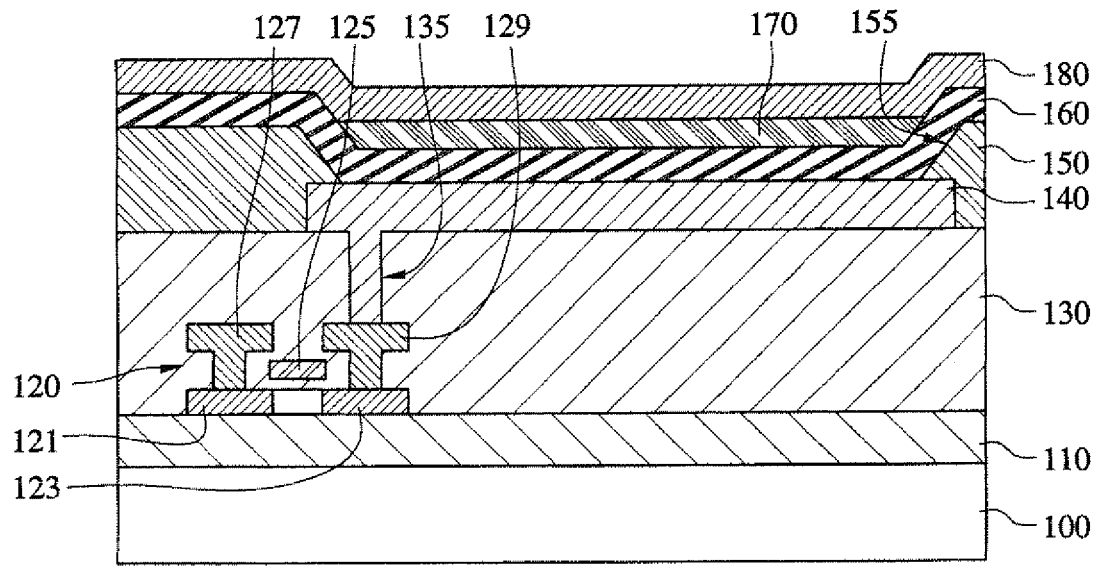
FIG. 1 is a cross sectional view of a conventional organic electroluminescent display.

The present invention will now be described in detail in connection with exemplary embodiments with reference to the accompanying drawings. For reference, like reference characters designate corresponding parts throughout several views.

Figure 2A:
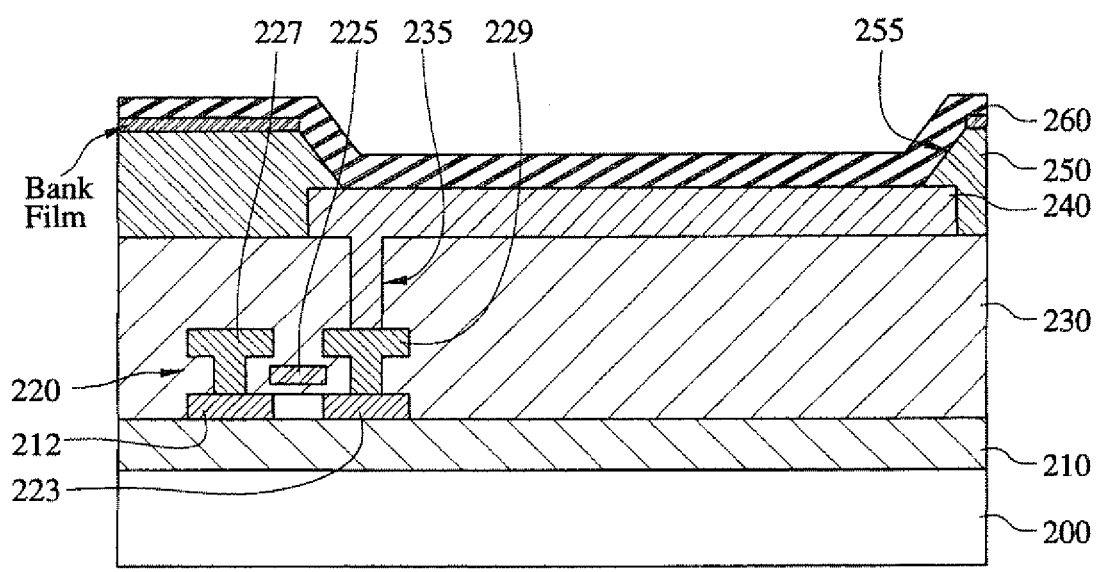
FIGS. 2A, 2B and 2C are cross sectional views for explaining a method for fabricating an organic electroluminescent display using UV surface treatment according to exemplary embodiments of the present invention.
Figure 2B:
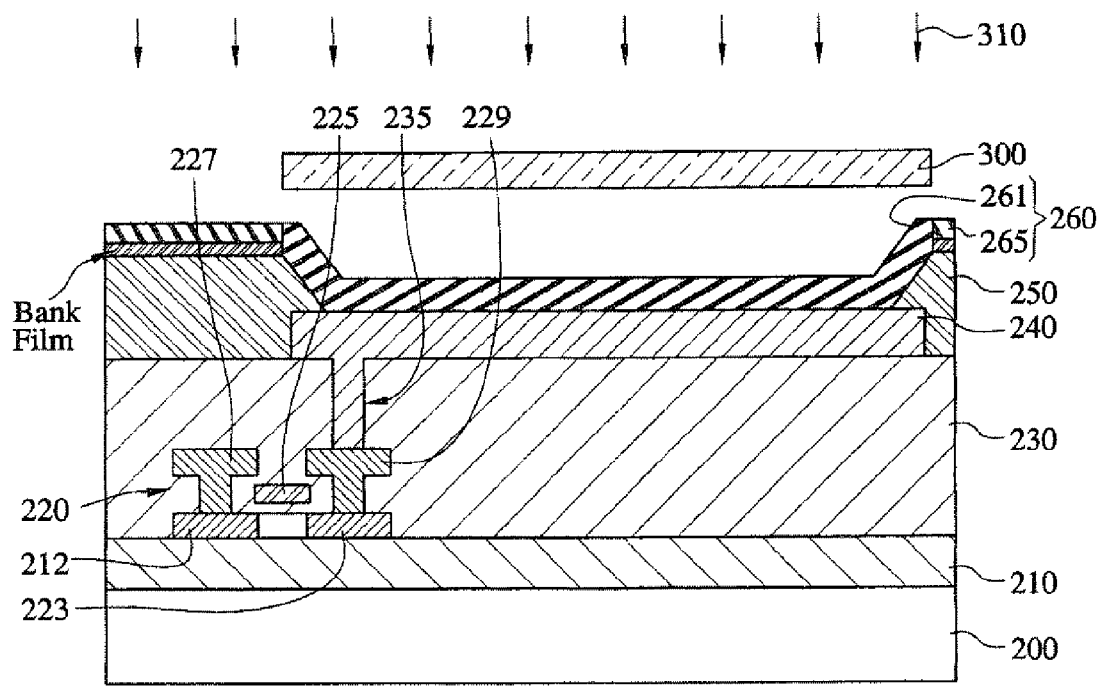
Figure 2C:
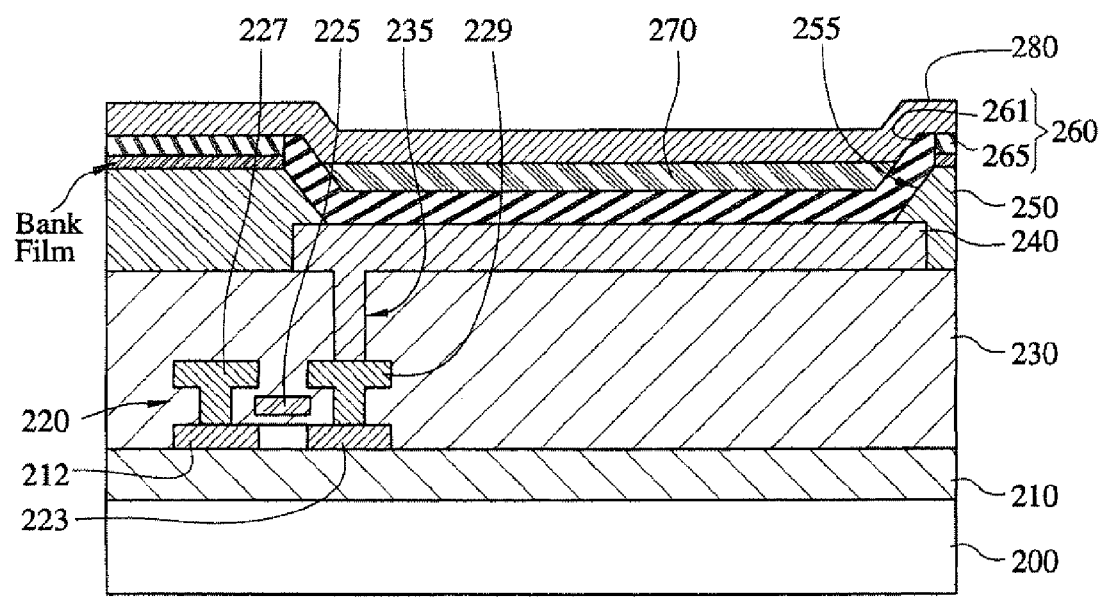

FIGS. 2A, 2B and 2C illustrate cross sectional structures for explaining a method for fabricating an active matrix organic electroluminescent display according to exemplary embodiments of the present invention.

Referring to FIG. 2A, a buffer layer 210 is formed on an insulating substrate 200, and a thin film transistor 220 is formed on the buffer layer 210. The thin film transistor 220 comprises a source region 212 and a drain region 223 which are formed on an activation layer. The thin film transistor 220 further comprises a gate 225, a source electrode 227 which is electrically connect to the source region 212 and a drain electrode 229, which is electrically connected to the drain region 223.

An insulating film 230 is formed over the buffer layer 210 and the thin film transistor 220. A via hole 235 exposes one of the source electrode 227 or the drain electrode 229, e.g., the drain electrode 229 and is formed by etching the insulating film 230. A lower electrode 240, which is connected to the drain electrode 229 through the via hole 235, is formed on the insulating film 230.

A planarization film 250 is formed by spin coating a planarization material, such as, an insulating layer of acryl on the substrate, and an opening part 255 is formed by etching the planarization film 250 so that a portion of the lower electrode 240 is exposed. A hole transport layer 260 is formed by spin coating a conductive polymer material, such as, PEDOT (Poly-3, 4-Ethylenediozythiphene) or PANI (polyaniline) on the substrate including the opening part 255.

As shown in FIG. 2B, the surface of the hole transport layer 260 is treated by selectively irradiating UV rays 310 onto the hole transport layer 260. The surface of the hole transport layer 260 is selectively treated by irradiating UV rays 310 onto the hole transport layer 260 while a portion of the hole transport layer 260 corresponding to the lower electrode 240, namely, a portion corresponding to a luminescence region of each pixel is masked using a mask 300. An un-masked portion 265 of the hole-transport layer 260 where the surface is treated by irradiation of UV rays, that is, the non-luminescence region of each pixel has hydrophobicity. The masked portion 261 of the hole-transport layer 260 on which UV rays are not irradiated, that is, the luminescence region has hydrophilicity. Therefore, un-masked portion 265 of the hole-transport layer 260 where the surface is treated by irradiation of UV rays has surface characteristics which are different from the masked portion 261 of the hole-transport layer 260 on which UV rays are not irradiated. Also, the un-masked portion 265 of the hole-transport layer 260 has a relatively high resistance value compared with the masked portion 261 of the hole-transport layer 260 so that the un-masked portion 265 where the surface is treated by irradiation of UV rays is in the nonconductive state.

Referring to FIG. 2C, a luminescent layer 270 is formed on the hole transport layer 260 via an inkjet process, wherein a solution containing an organic polymer material is dispersed onto the hole transport layer 260. The solution which is ejected from the inkjet head is prevented from dispersing onto neighboring pixels because the surface of the un-masked portion 265 of the hole-transport layer which corresponds to a non-luminescence region in the hole-transport layer 260 is treated with UV rays. Thus, the un-masked portion 265 of the hole transport layer 260 which corresponds to a non-luminescence region has surface characteristics different from the masked portion 261 of the hole transport layer 260 which corresponds to a luminescence region over the lower electrode 240. Therefore, the luminescent layer 270 does not influence neighboring pixels and is formed over the upper portion of the lower electrode 240 of a relevant pixel. It is possible for the luminescent layer 270 to only be formed on the upper portion of the lower electrode 240 of a relevant pixel.

Furthermore, the masked portion 261 of the hole-transport layer which corresponds to a luminescence region in the hole transport layer 260 maintains the conductive state and is to improve luminescence efficiency by improving the injection efficiency of holes from the lower electrode 240 to the organic luminescent layer 270. The un-masked portion 265 of the hole-transport layer 260 becomes non-conductive by the UV surface treatment so that flow of leakage current between adjacent pixels via the hole transport layer 260 and the lower electrode 240 is prevented.

A method for fabricating an organic electroluminescent display using UV surface treatment of the present invention can not only be applied to active matrix and passive matrix displays as well as front-emission luminescent and rear-emission luminescent displays, but can also be applied to a method for fabricating a flat panel display using inkjet process.

Although exemplary embodiments of the present invention illustrate methods for UV surface treatment by forming a hole transport layer on a planarization film, the various embodiments of the present invention can also be applied to a method for fabricating an organic electroluminescent display by forming the hole transport layer and performing UV surface treatment after forming a bank layer on the planarization film 250.

An organic electroluminescent display and a method for fabricating the same according to the present invention prevent all and/or substantially all leakage current between adjacent pixels by irradiating UV rays and treating the surface of a portion of the hole transport layer other than the luminescent region of each pixel. Thus, printing quality is improved when forming a luminescent layer by an inkjet process and the resistance value of a portion on which UV rays are irradiated is increased.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. An organic electroluminescent display, comprising:
a lower electrode, a hole transport layer, a luminescent layer and an upper electrode sequentially formed on a substrate, wherein a portion of the hole transport layer corresponding to the lower electrode has a surface characteristic and a resistance value different from a portion of the hole transport layer other than the portion corresponding to the lower electrode; and
an insulating film formed on the substrate so that a portion of the lower electrode is exposed,
wherein the portion of the hole transport layer corresponding to the lower electrode is hydrophilic, wherein the portion of the hole transport layer other than the portion corresponding to the lower electrode is hydrophobic, and wherein the insulating film is a planarization film with a bank film formed thereon.

2. An organic electroluminescent display, comprising:

a lower electrode formed on a substrate;

an insulating film formed on the substrate so that a portion of the lower electrode is exposed;

an organic thin film layer formed on an exposed lower electrode and the insulating film;

a luminescent layer formed on a portion of the organic thin film layer corresponding to the lower electrode; and an upper electrode formed on the substrate, wherein a portion of the organic thin film layer under the luminescent layer has a surface characteristic different than a surface characteristic of another portion of the organic thin film layer other than the portion under the luminescent layer, wherein the portion of the organic thin film layer under the luminescent layer is hydrophilic, wherein the another portion of the organic thin film layer other than the portion under the luminescent layer is hydrophobic, and wherein the insulating film is a planarization film with a bank film formed thereon.

3. The organic electroluminescent display according to claim 2, wherein the organic thin film layer is a hole transport layer.

4. The organic electroluminescent display according to claim 3, wherein the hole transport layer is formed of PEDOT (Poly-3,4-Ethylenedioxythiophene) or PANI (polyaniline).

5. The organic electroluminescent display according to claim 2, wherein the another portion of the organic thin film layer other than the portion under the luminescent layer, has an UV ray treated portion and a higher resistance value than the portion under the luminescent layer, and the another portion of the organic thin film layer helps prevent leakage current between the organic thin film layer and the lower electrode.

* * * * *